United States Patent [19]
Aldrich

[11] Patent Number: 5,917,230
[45] Date of Patent: Jun. 29, 1999

[54] FILTER CAPACITOR CONSTRUCTION

[75] Inventor: Larry L. Aldrich, Colorado Springs, Colo.

[73] Assignees: United Memories, Inc., Colorado Springs; Nippon Steel Semiconductor Corporation, Chiba, Japan

[21] Appl. No.: 08/838,662

[22] Filed: Apr. 9, 1997

[51] Int. Cl.⁶ .................................................. H01L 29/00
[52] U.S. Cl. ........................ 257/532; 257/207; 257/535
[58] Field of Search .................................. 257/532, 506, 257/306, 207, 924, 533, 534, 535; 438/396; 361/684, 306.2

[56] References Cited

U.S. PATENT DOCUMENTS

| | | | |
|---|---|---|---|
| 4,553,050 | 11/1985 | Feinberg et al. | 307/443 |
| 4,654,689 | 3/1987 | Fujii | 357/51 |
| 4,879,631 | 11/1989 | Johnson et al. | 361/684 |
| 4,890,192 | 12/1989 | Smith | 257/532 |
| 5,032,892 | 7/1991 | Chern et al. | 357/51 |
| 5,307,309 | 4/1994 | Protigal et al. | 365/63 |
| 5,472,900 | 12/1995 | Vu et al. | 438/396 |
| 5,478,770 | 12/1995 | Kim | 438/396 |
| 5,561,789 | 10/1996 | Lin et al. | 395/500 |
| 5,598,029 | 1/1997 | Suzuki | 257/532 |
| 5,608,246 | 3/1997 | Yeager et al. | 257/532 |
| 5,631,492 | 5/1997 | Ramus et al. | 257/532 |
| 5,656,834 | 8/1997 | Grzyb et al. | 257/532 |

FOREIGN PATENT DOCUMENTS

| | | |
|---|---|---|
| 0 409 256 A2 | 7/1990 | European Pat. Off. . |
| 0 575 892 A1 | 12/1993 | European Pat. Off. . |
| 0 644 594 A1 | 3/1995 | European Pat. Off. . |

*Primary Examiner*—Sara Crane
*Attorney, Agent, or Firm*—Stuart T. Langley; William J. Kubida; Holland & Hart llp

[57] ABSTRACT

An integrated circuit having a voltage source and a plurality of conductive power bus tiers extending across the integrated circuit. Each of the power bus tiers are electrically coupled in parallel to the voltage source. The integrated circuit includes a filter capacitor having a first plate and a second plate that are separated by a capacitor dielectric. The first plate forms a bus strap coupling to each of the plurality of power bus tiers.

3 Claims, 8 Drawing Sheets

FILTER CAPACITOR CONSTRUCTION

BACKGROUND OF THE INVENTION

1. Field of the Invention

The present invention relates, in general, to capacitor structures, and, more particularly, to filter capacitor structures for monolithically integrated circuits.

2. Relevant Background

On large integrated circuits (ICs) it is necessary to route the direct current (DC) power buses to all the circuits on the IC requiring power. The DC power bus system distributes positive and/or negative power throughout the IC. Typically one of the polarities is ground and the other is designated as $V_{CC}$ or $V_{DD}$. The DC power distribution system provides low resistance paths between the power supply nodes and each circuit being powered. Voltage drops along the power distribution bus should not affect other circuits being powered from the same bus, even during high current loads.

Power is supplied to circuitry formed on an IC from, for example, an external power supply coupled to wire bonding pads. Alternatively, many ICs provide an on-chip voltage regulator to decrease a higher voltage (e.g., 5.0 V) provided by an external power supply to a lower voltage on the IC. To limit undesirable voltage ripple on the internal voltage supply node, the time constant of the regulator is desirably much longer than the internal cycle of the device. This prevents undesired voltage ripple within a cycle that can upset analog voltage levels. A filter capacitor is coupled across the power supply wire bonding pads (or the on-chip voltage regulator output nodes) to help smooth voltage fluctuations at the power and ground nodes on the IC and fluctuations caused by the external power supply.

In practice, filter capacitors consume a great deal of chip area without adding functionality other than the aforementioned filtering function. In general, cost and chip size considerations dictate limiting the filter capacitor to modest sizes. One strategy for providing a large filter capacitance is to dice the filter capacitor into pieces and distribute the pieces throughout the IC chip in areas that are not used for circuitry. The diced pieces are then coupled in parallel to form the requisite, relatively large capacitance.

Some conventional DC power distribution bus layouts use a single large bus that is branched repeatedly to attempt to reach every element to be powered. However, because of the difficulty inherent in crossing one conductor over another, it is often not possible to guarantee that all circuits can be powered unless multiple metal layers are used. Additional metal layers increase chip cost significantly. Also, the branching structure of the buses causes high currents to flow in some portions and could cause voltage sagging and undesired circuit interaction. Moreover, such relatively high resistance power distribution buses dissipate energy as heat that must be removed from the IC package. Heat removal limits device performance and functionality and makes the IC larger and thus more expensive, as well as making the packaging more expensive.

"Multi-tier", "grid" or "mesh" power distribution buses comprise a plurality of power conductors that are coupled to a common power supply or ground node. The power conductors are typically arranged parallel to each other and extend in one direction across the integrated circuit. Metal straps running perpendicular to the power conductors are used to couple each tier of the power conductors together in a grid fashion. These perpendicular straps are generally laid out to be relatively wide to provide low resistance connections. Also, the perpendicular straps must be placed frequently along the length of the power conductors to effectively reduce sagging of the voltage on the power conductors.

In addition to power distribution buses, ICs typically include signal buses for distribution of data and control signals about the IC. A gridded power distribution bus requires that the signal buses traverse the power distribution buses at many locations. When metal straps are used, the parasitic capacitance between the signal buses and the power distribution buses is relatively high because there is only relatively thin insulation between the signal buses and the metal straps. This high parasitic capacitance reduces the maximum signal frequency on the signal buses thereby reducing speed and functionality of the IC.

An example of high current demand circuits are sense amplifiers in a dynamic random access memory (DRAM). In a typical DRAM circuit, one sense amplifier is supplied for each bit line pair in the device. For each sense amplifier, the standby (i.e., non-switching) state requires relatively little current. When activated, however, each sense amplifier may draw more than 1000 times its standby current. Moreover, state of the art DRAM devices may have more than 1000 sense amplifiers activated simultaneously, resulting in very high current draw on the regulator. During high current demand, regulation can become poor and the chip's internal voltage levels can drop or "sag" significantly if the power distribution bus exhibits high resistance.

Capacitor structures used to implement a filter capacitor are desirably volumetrically efficient. In other words, the capacitor structure should have a high capacitance per unit volume ratio. Hence, the structures and processes used to implement capacitors are desirably compatible with a thin capacitor dielectric and allow topographically complex (i.e., non-planar or folded) capacitor plates to increase unit capacitance.

SUMMARY OF THE INVENTION

The present invention relates to an integrated circuit having a voltage source and a plurality of conductive power bus tiers extending across the integrated circuit. Each of the power bus tiers are electrically coupled in parallel to the voltage source. The integrated circuit includes a filter capacitor having a first plate and a second plate that are separated by a capacitor dielectric. In this manner the first plate forms a bus strap coupled to each of the plurality of power bus tiers.

In another aspect, the present invention involves an integrated circuit including a voltage supply and a plurality of power conductors coupled to the voltage supply and extending across the integrated circuit. A plurality of filter capacitor portions are distributed across the integrated circuit. Each of the filter capacitor portions have a node coupled to more than one of the plurality of conductors.

In still another aspect, the present invention involves a method for making an integrated circuit on a substrate. Integrated circuitry is formed in selected first portions of the substrate. A plurality of capacitors are formed in selected second portions of the substrate. A plurality of conductive power supply bus tiers are formed on the substrate such that each bus tier is directly electrically coupled to each of the capacitors and to selected portions of the integrated circuitry.

DETAILED DESCRIPTION OF THE PREFERRED EMBODIMENTS

Figure 1:
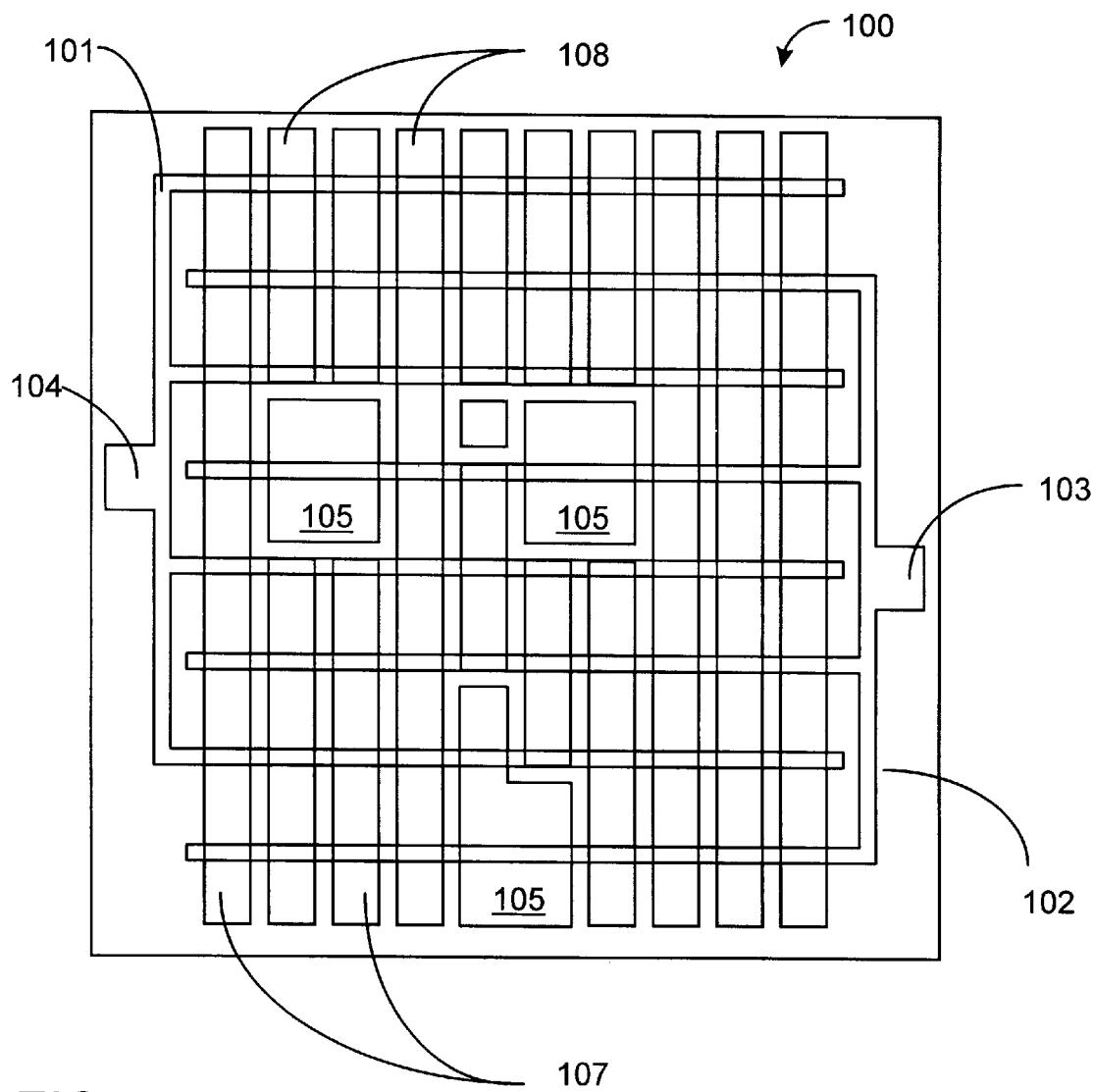
FIG. 1 shows a simplified layout of an integrated circuit using a power distribution system in accordance with an embodiment of the present invention.

FIG. 1 shows an integrated circuit 100 having tiered, gridded, or meshed power distribution buses 101 and 102. Power is supplied to IC 100 from an external power source coupled to power supply bond pads 103 and 104. In FIG. 1 bond pad 103 is coupled to ground and bond pad 104 is coupled to VCC. An equivalent substitute for bond pads 103 and 104 is an on-chip voltage regulator that supplies voltage to internal circuitry. Power distribution buses 101 and 102 extend about IC 100 to distribute power to functional circuitry formed in active areas 105 of IC 100.

In order to join the tiers of the power distribution buses 101 and 102, perpendicular metal straps (not shown) have been used to minimize voltage sagging during activation of high current loads. Signal lines that cross over the metal straps in previous designs are subject to undesirable parasitic capacitance and cross-talk from noise coupled through the power distribution buses.

An important feature in accordance with the present invention is the use of filter capacitor structures 107 and 108 running perpendicular to tiers of one or more power distribution buses 101 and 102 to minimize or eliminate the need for perpendicular metal straps (not shown). By using filter capacitors 107 and 108 to replace some or all of the metal straps, signal lines 201 in FIG. 2 that otherwise would have crossed over the metal straps in prior designs are able to cross over filter capacitors 107 and 108 instead. Because the insulator thickness between the signal lines 201 and capacitors 107 and 108 is greater than the insulator thickness between metal straps and the signal lines, parasitic capacitance and cross-talk in the signal lines are reduced. Also, capacitors 107 and 108, which may be supplemented with a relatively small number of metal straps, provide low resistance power distribution buses 101 and 102 that avoid voltage sagging during activation of high current loads.

Filter capacitor 107 and 108 replace or minimize the perpendicular power grid straps while maintaining a low resistance coupling between tiers of power distribution buses 101 and 102. The filter capacitor plates (e.g., 304 and 306 in FIG. 3) serve as a conductive tunnel under signal lines 201. Even though capacitor plates 304 and 306 may comprise a high resistivity material, they can be made wide enough so that only a few squares of resistance, or less, are placed between adjacent tiers of the power distribution buses 101 and 102 (shown in FIG. 1 and FIG. 2). Because a significant portion of IC 100 is already dedicated to the filter capacitors, sizing the width of capacitor plates 304 and 306 to provide low resistance tunnels for the power distribution buses does not significantly impact circuit density on IC 100. There typically are no functionally or parametrically imposed maximum size limitations on filter capacitors 107 and 108.

Figure 2:
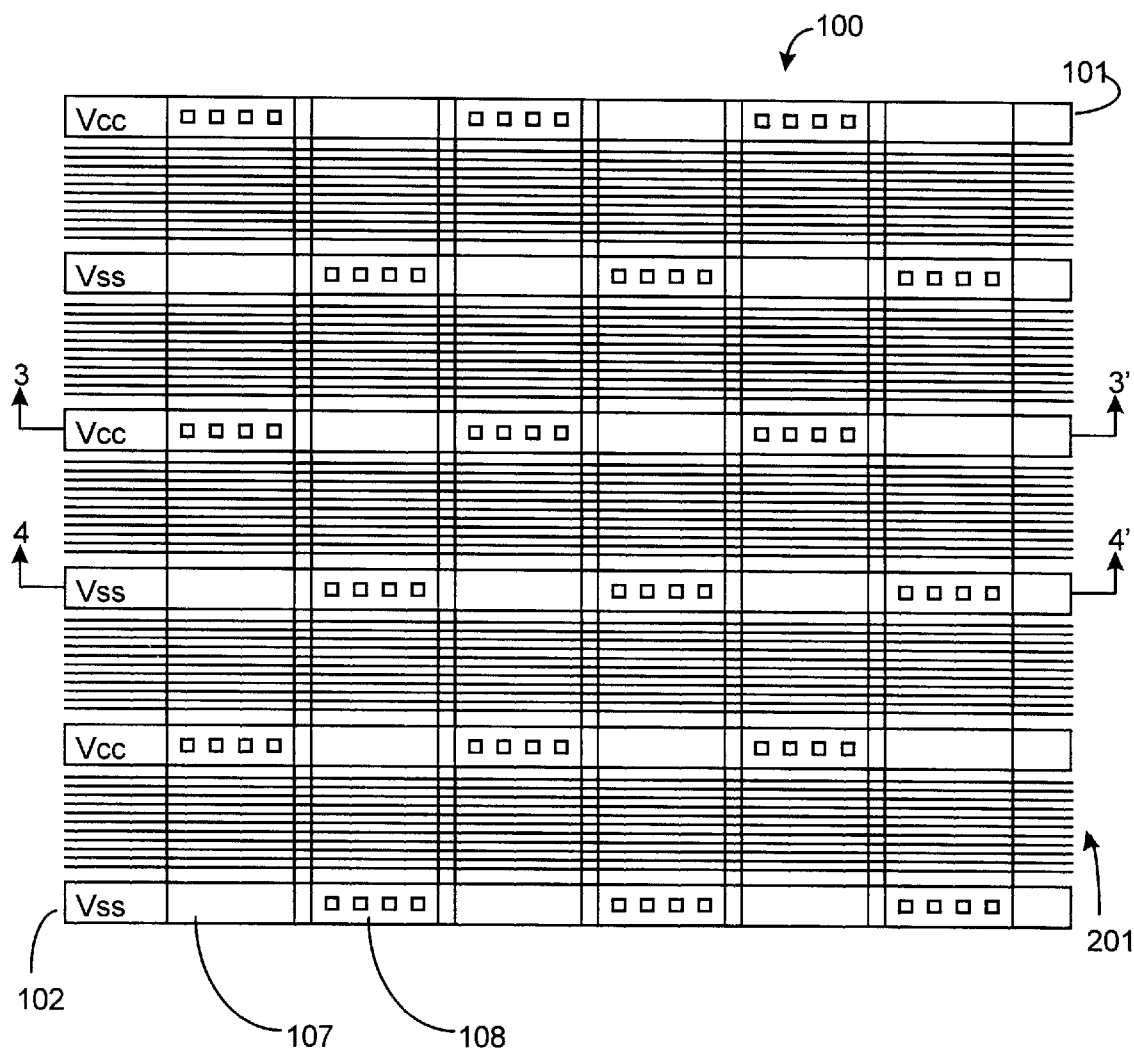
FIG. 2 shows an enlarged portion of the IC of FIG. 1.

As shown in FIG. 2, filter capacitors 107 and 108 are desirably contacted frequently by conductors making up the power distribution buses 101 and 102. In a first embodiment, filter capacitors 107 and 108 are configured as two series-coupled capacitors so as to reduce voltage stress on the capacitor dielectric and to provide an intermediate capacitor plate 302 (shown in FIG. 3) that can be used as a reference voltage. Capacitor 107 is coupled to the VCC power supply node and capacitor 108 is coupled to the VSS power supply node in the particular example of FIG. 2. It should be understood that the specific dimensions of the elements and structures shown in FIG. 2 are exemplary, and that other dimensions are equivalent to the specific embodiments described herein as long as a suitable low resistance coupling is made between adjacent tiers of power distribution buses 101 and 103.

Figure 3:
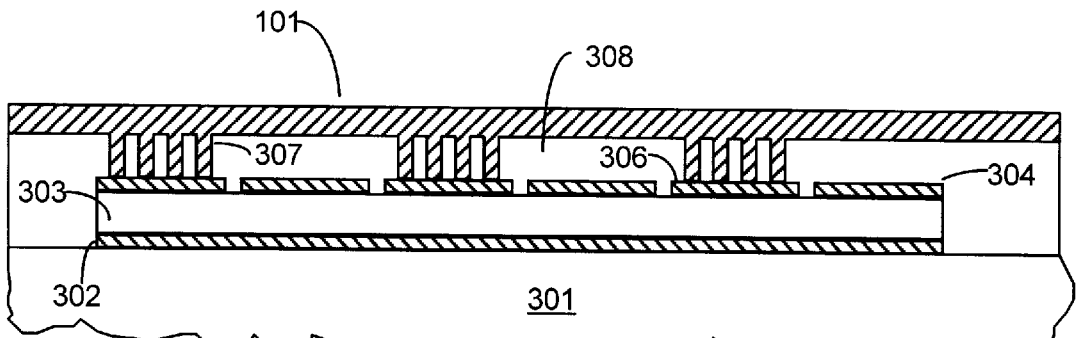
FIG. 3 shows a first cross-sectional view of a first embodiment power distribution bus in accordance with the present invention.
Figure 4:
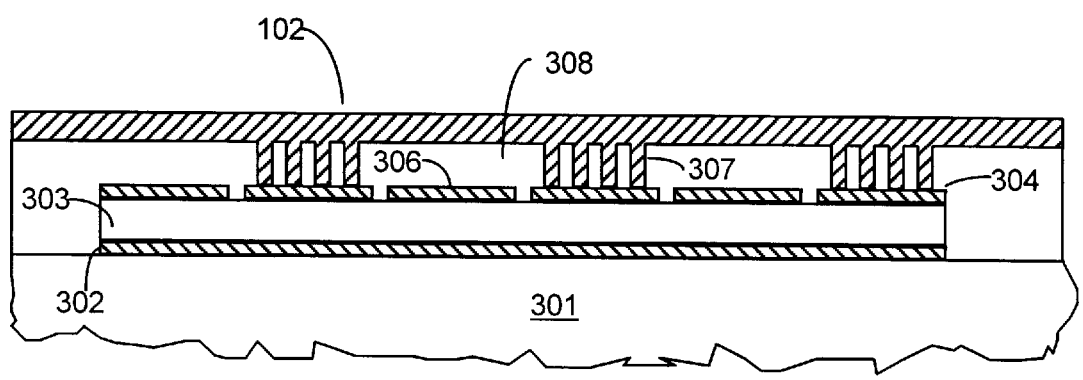
FIG. 4 shows a second cross-sectional view of the first embodiment power distribution bus in accordance with the present invention.

FIG. 3 shows IC 100 in cross-section view taken through the 3–3' line of FIG. 2. Likewise, FIG. 4 shows IC 100 in cross-section view taken through the 4–4' of FIG. 2. The capacitor structure in accordance with the present invention is desirably formed on a supporting substrate such as substrate 301. Substrate 301 may be a semiconductor such as silicon, germanium, gallium-arsenide, or a semi-insulating or insulating material. Substrate 301 may comprise one or more layers of material so as to be compatible with available processing technology.

Capacitor plate 302 is formed on a surface of substrate 301 by, for example, deposition and patterning techniques. Capacitor plate 302 may comprise doped polysilicon, metal, or polysilicon silicide, for example. Capacitor plate 302 is covered by a suitable capacitor dielectric 303 such as deposited or thermally grown silicon dioxide, silicon nitride, and the like. The thickness of dielectric 303 in FIG. 3 and FIG. 4 is exaggerated with respect to the other structures for ease of illustration and understanding. In a practical implementation, thickness of dielectric 303 is selected to provide a desired capacitance per unit area (i.e., unit capacitance) and voltage withstanding ability.

Capacitor plates 304 and 306 are formed on the upper surface of dielectric 302 preferably by deposition of a single conductive layer and subsequent patterning. Capacitor plates 304 and 306 comprise a conductive material such as doped polysilicon, metal, or polysilicon silicide, for example. Capacitor plates 304 and 306 are patterned to run perpendicularly to power distribution buses 101 and 102 as described hereinbefore. An insulating layer 308 such as silicon oxide (doped or undoped) or silicon nitride is formed over capacitor plates 304 and 306.

In FIG. 3, conductive vias 307 are formed in a dielectric layer over capacitor plates 304 and 306. A sufficient number of vias 307 are provided to result in a desired low resistance coupling between adjacent tiers of power distribution bus 101 through capacitor plates 306. Likewise, in FIG. 4, a sufficient number of vias 307 are formed to provide a desired low resistance coupling between power distribution bus 102 and capacitor plates 304. Vias 307 can be formed using any available contact etch and conductive fill techniques. Similarly, power distribution bus 101 can be formed using any available process for conductive trace formation such as thin film deposition and photolithographic patterning techniques.

Figure 5:
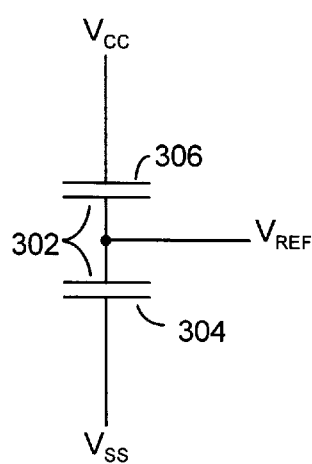
FIG. 5 shows a circuit diagram of the filter capacitor structure implemented by the first embodiment in accordance with the present invention.

FIG. 5 schematically illustrates the capacitor structure provided by the first embodiment. Upper capacitor plate 306 is coupled to a positive power source VCC. Capacitor plate 304 is coupled to a negative power source VSS. Capacitor plate 302 serves to create two series-coupled capacitors having both terminals of the capacitor accessible from the upper surface of IC 100 for easy connection to power distribution buses 101 and 102. The power supply voltage (i.e., VCC-VSS) is divided equally across the two capacitors such that capacitor dielectric 303 sees only 50% of the total voltage across the voltage supply nodes. This allows capacitor dielectric to be thinner than would otherwise be required for reliable operation for any selected voltage between the supply nodes. Moreover, bottom capacitor plate 302 can be accessed from interconnections on the upper surface, or by circuit components built in substrate 301, to provide a reference voltage VREF that is approximately (VCC-VSS)/2. The VREF terminal can be used as a precharge reference voltage in memory circuits and to test integrity of the filter capacitor without the high current dangers associated with coupling power supply voltages to the filter capacitor.

Figure 6:
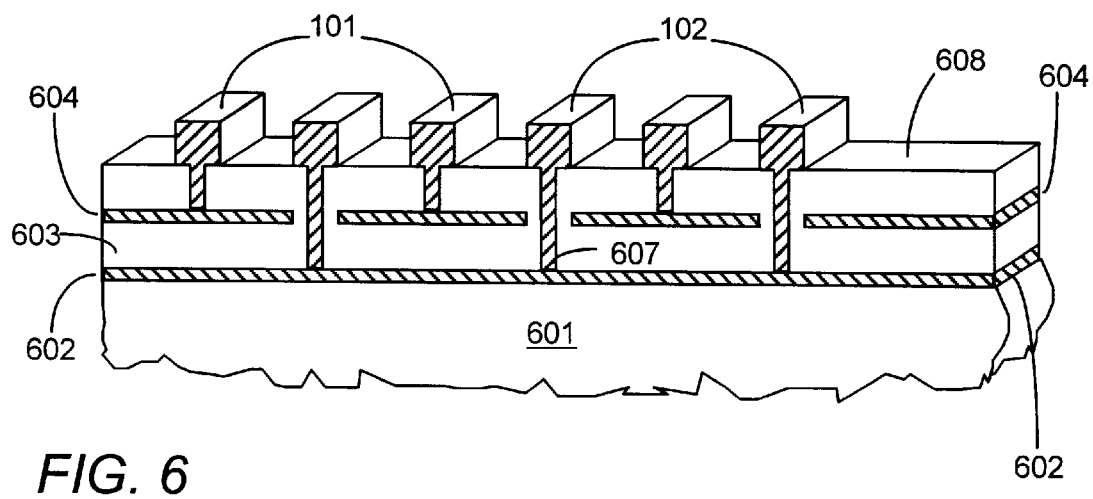
FIG. 6 shows a cross sectional view of a second embodiment power distribution bus in accordance with the present invention.

In a second embodiment (shown in FIG. 6 and FIG. 7), the filter capacitor is configured as a single capacitor coupled across power supply nodes of an IC. Capacitor plate 602, capacitor dielectric 603, and capacitor plate 604 are formed in an analogous manner to elements 302, 303, and 304 of the first embodiment. However, capacitor plate 604 is formed as a single capacitor plate in contrast to being patterned as two plates as was done with capacitor plates 304 and 306. Capacitor plate 604 is covered with an insulating dielectric 608. Conductive vias 607 are formed through openings in capacitor plate 604 so as to electrically couple power distribution bus 102 to capacitor plate 604. Power distribution bus 101 is coupled to capacitor plate 604 using techniques and structures analogous to that described for the first embodiments.

Figure 7:
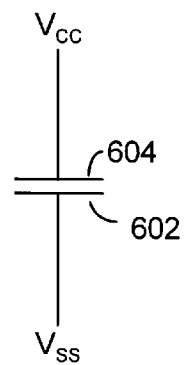
FIG. 7 shows a circuit diagram of the filter capacitor structure implemented by the second embodiment power distribution bus.

FIG. 7 schematically illustrates a filter capacitor formed in accordance with the second embodiment. In FIG. 7 the VCC power supply node is coupled to upper plate 604 while the VSS power supply node is coupled to lower capacitor plate 602. The entire supply voltage (VCC-VSS) is distributed across capacitor dielectric 603, which may be desirable in some application.

Figure 8:
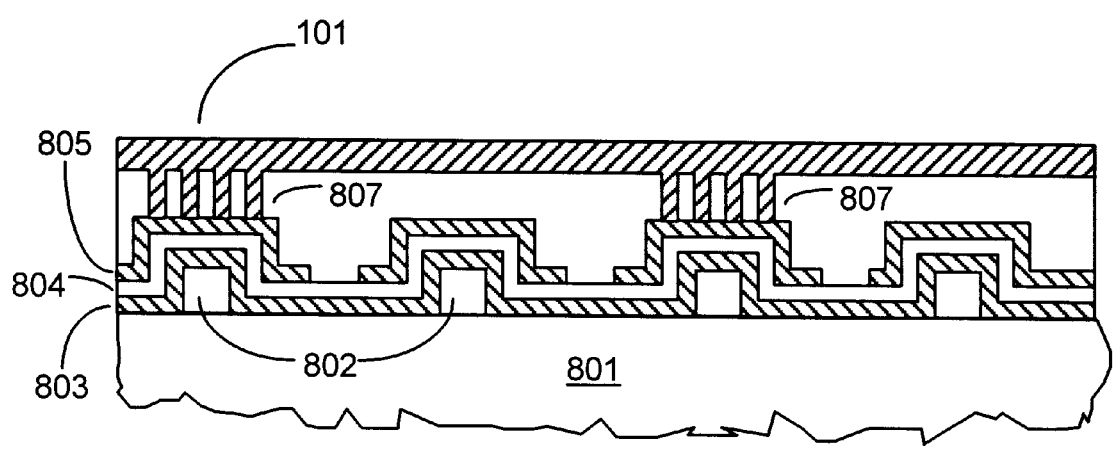
FIG. 8 shows a cross sectional view of an optional modification in accordance with the present invention.
Figure 9:
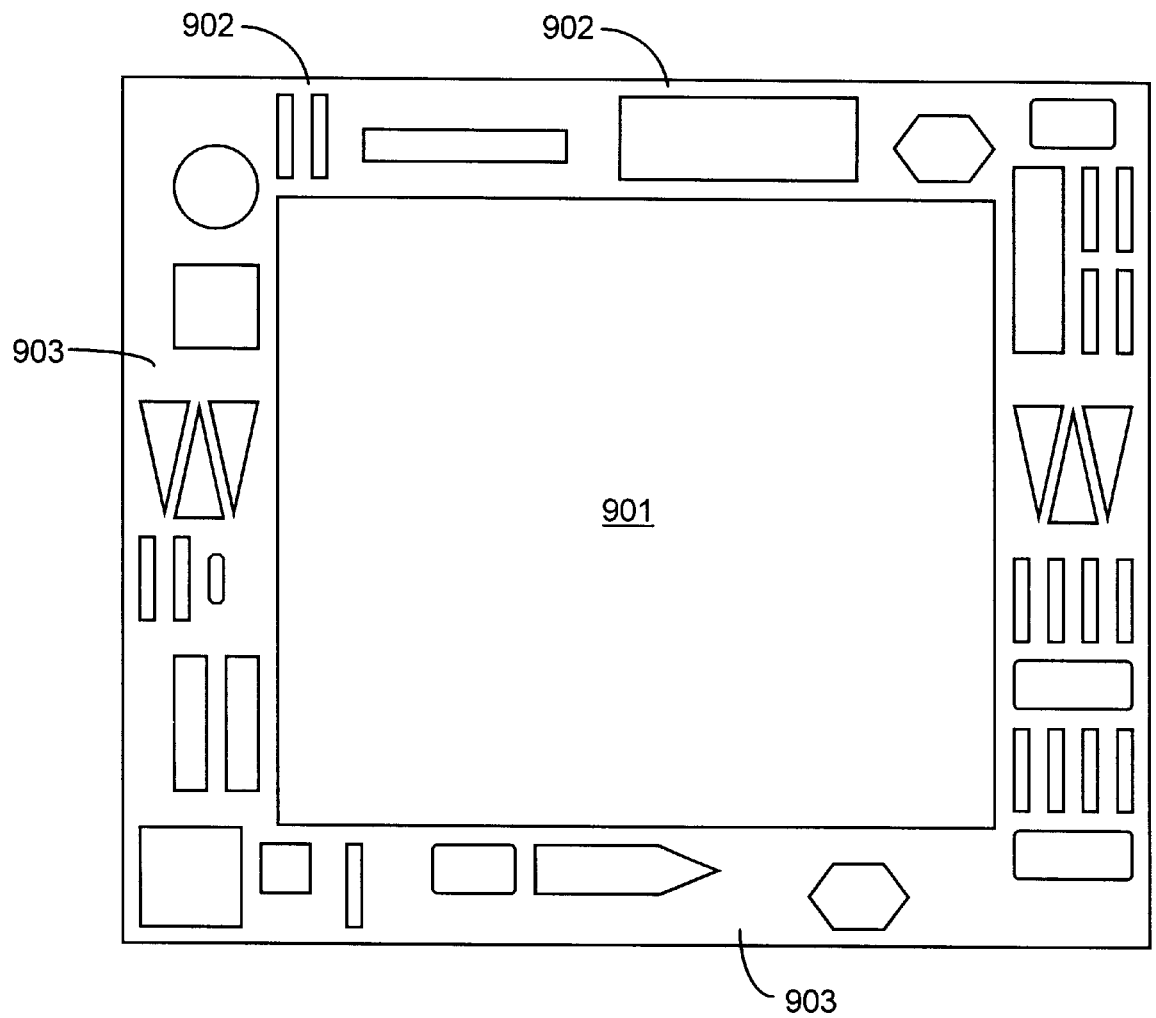
FIG. 9 shows a simplified layout of an integrated circuit.

FIG. 8 shows a modification to the preferred embodiments that enables higher unit capacitance filter capacitors. The modification shown in FIG. 8 can be used with either the first or the second embodiment described hereinbefore. Prior to the formation of lower capacitor plate 302 or 102, topographical polygons 802 are formed on substrate 801. Topographical polygons 802 comprise insulating, semi-insulating, semiconducting, or conducting material that can be applied and patterned in a manner compatible with other processing on IC 100. Alternatively, topographical polygons 802 could be implemented by etching recesses or trenches into the surface of substrate 801. All subsequent processing performed on top of topographical polygons results in translation of the non-planarity in to the capacitor structures in accordance with the present invention. As shown in FIG. 8, capacitor plates 803 and 805, as well as capacitor dielectric 804 are provided with a non-planar or folded topography that increases surface area and hence increases unit capacitance. Power distribution bus 101 and conductive vias 807 are formed in a manner analogous to that described in reference to FIG. 3.

FIG. 9 through FIG. 12 illustrate a suitable IC layout strategy in accordance with the present invention. Functional circuitry such as array circuitry 901 and supporting logic and signal processing circuitry 902 shown in FIG. 9. are placed in the IC layout. Array circuitry 901 represents devices such as a memory array, programmable logic array, or the like that includes a plurality of atomic design units placed by step-and-repeat processes or the equivalent. By using step-and-repeat design techniques a great deal of design effort is used in each atomic unit of the array to achieve high device packing density. The supporting logic and signal processing circuitry 902 include devices such as decoders, multiplexors, switches, and the like that may exist in predefined libraries as functional units, or may be specifically designed for a given circuit. The variety of shapes for circuitry 902 conveys the fact that circuitry 902 can take on any geometry. The outer boundaries of active device areas 901 and 902 when excluded from the total IC area define "open" areas 903. Although great care is taken to minimize open areas 903 in a typical design, in practice a significant amount of open areas 903 remain after layout of active device regions 901 and 902.

Power distribution buses (not shown in FIG. 9) and signal lines (not shown in FIG. 9) are placed in open areas of the IC layout using any available layout technology or design rules to coupled as required by active device areas 901 and 902.

Next, the filter capacitors are placed by laying out capacitor plate portions running perpendicular to the tiers of the power distribution buses 101 and 102 in open areas 903. In accordance with the first embodiment, the plates of the filter capacitors are "diced up" (i.e., broken into many plate portions) before placement into open areas 903 so that the plate portions run perpendicular to the tiers of the power distribution buses 101 and 102 (shown in FIG. 1).

A significant advantage of the present invention is that capacitors can be placed in substantially all of open areas 903. In prior designs, the strapped power distribution busses created "landlocked" regions within open areas 903 that could not be used for capacitor placement. This resulted not only in significant waste of IC real estate, but also forced the process of capacitor placement to be performed manually. The additional constraint imposed by the power supply bus straps made automated placement of the capacitors difficult, resulting in inefficient designs. Hence, when strapped power supply buses were used, capacitor placement was performed manually by a skilled IC layout engineer. In contrast, the power supply bus straps do not impose a significant constraint on capacitor placement in accordance with the present invention. Even if some straps are used in accordance with the present invention, the number of straps is greatly reduced and their placement is much more flexible. Hence, capacitor layout is not unduly constrained by the location of power supply bus tiers using the method in accordance with the present invention. As a result, it has been found that automated design tools can not only place capacitors effectively, but can place them at a significantly greater density that was possible using prior manual or automated IC layout techniques.

Figure 10:
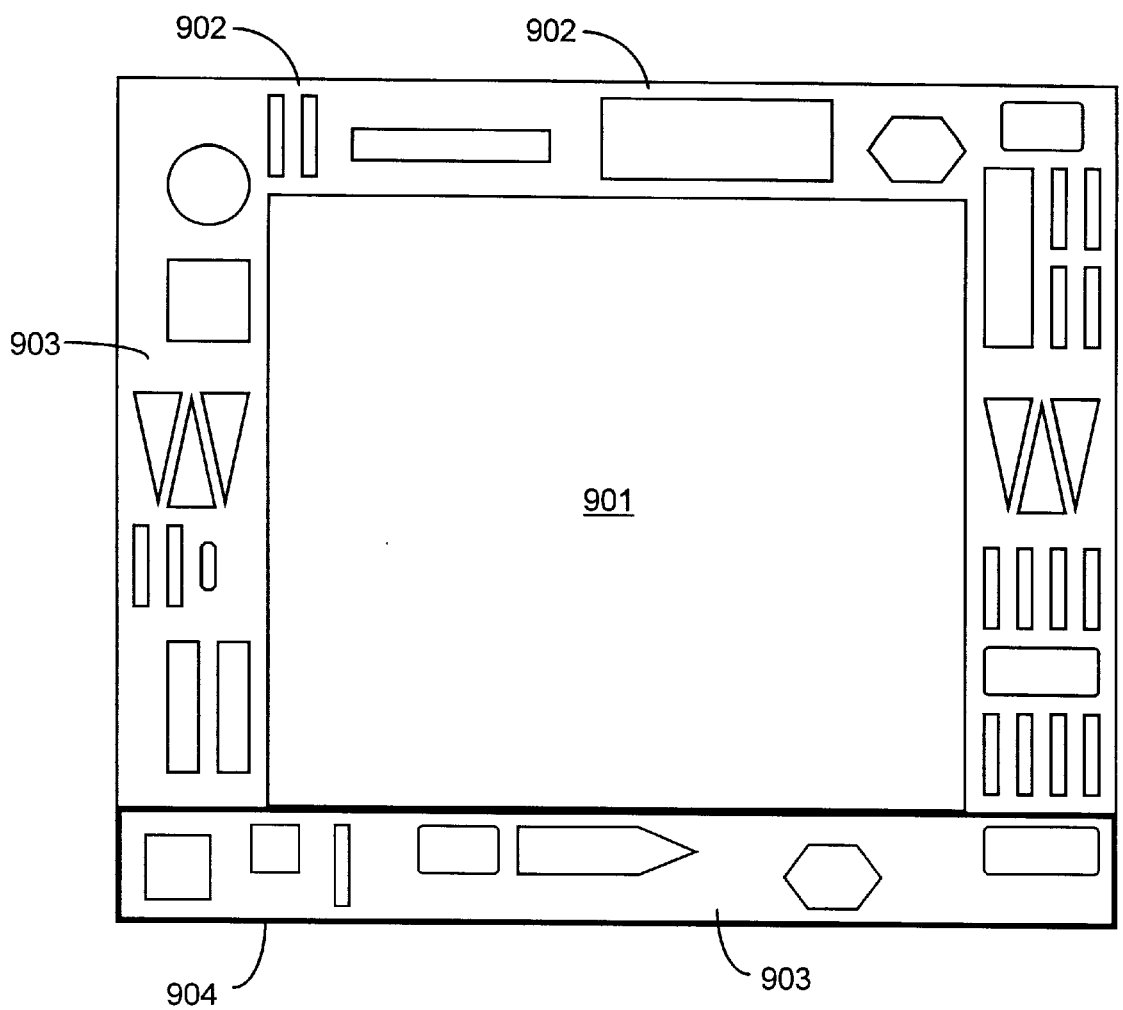
FIG. 10 shows the integrated circuit of FIG. 10 with an area selected for analysis.

In a preferred implementation illustrated in FIG. 10, a portion 904 of the IC layout is selected for analysis before placing the capacitors. Portion 904 is selected primarily to minimize the computation time required and is performed manually in the preferred embodiment. An IC designer selects area 904 simply by looking for portions of the IC layout with significant open areas 903.

Figure 11:
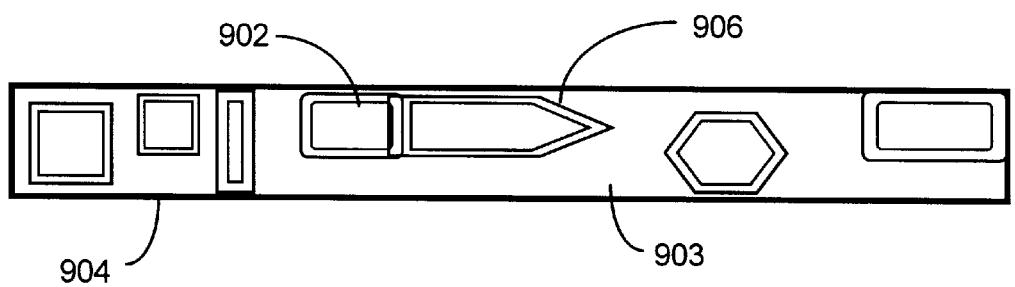
FIG. 11 shows a selected portion of the integrated circuit of FIG. 10 after processing in accordance with the present invention.

As shown in FIG. 11, boundaries of active device areas 902 within the selected area 904 are "grown" using known image processing techniques to provide grown shapes 906 that provide spacing required by design rules for a given IC layout design. These design rules will vary from design to design, but are well understood by the IC layout engineer or technician. The "growing" process can be accomplished using many available IC layout automated design tools.

Figure 12:
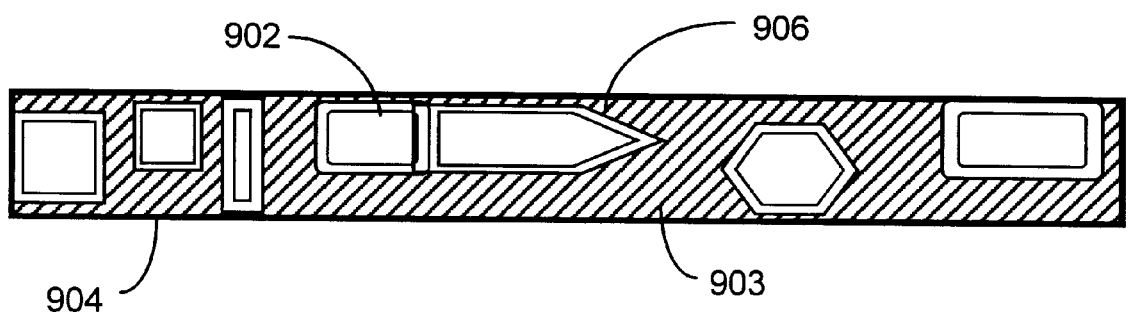
FIG. 12 shows the selection portion of FIG. 11 after processing to identify available area in accordance with the present invention.

As shown in FIG. 12, the grown areas 906 are excluded from the open areas 903 in selected area 904 using Boolean logic functions such as an exclusive-or. The resulting open areas 903 shown as cross-hatched areas in FIG. 12, are suitable candidates for capacitor placement. Capacitor plate portions can be placed by the automated layout tool in any location of the open areas 903 that crosses under (i.e. overlaps) at least one power supply bus tier.

A sufficient number of contact areas or vias (not shown) for electrical contact with power distribution buses 101 and 102 are placed in the overlapping regions between to allow the capacitor plates to provide a low resistance coupling between the power distribution tiers. Power distribution buses 101 and 102 function to couple all of the diced and distributed portions of the capacitors in parallel to form a single or dual filter capacitor.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. An integrated circuit comprising:

a voltage source;

a plurality of conductive power bus tiers extending across the integrated circuit, wherein each of the power bus tiers are electrically coupled in parallel to the voltage source;

a filter capacitor comprising a first plate and a second plate wherein the first and second plates are separated by a capacitor dielectric and the first plate forms a bus strap coupling to each of the plurality of power bus tiers;

a third plate formed in a common plane with the first plate and separated from the second plate by the capacitor dielectric;

a second voltage source; and a plurality of second conductive power bus tiers extending across the integrated circuit, wherein each of the second power bus tiers are electrically coupled in parallel to the second voltage source and the third plate forms a bus strap coupling to each of the plurality of second power bus tiers.

2. The integrated circuit of claim 1 wherein the first and second conductive power bus tiers are arranged in parallel and the first and third plates extend perpendicularly to the first and second conductive power bus tiers.

3. The integrated circuit of claim 2 further comprising an electrical contact to the second plate for providing a reference voltage to the integrated circuit.

* * * * *